United States Patent
Yoon et al.

(10) Patent No.: US 7,977,664 B2
(45) Date of Patent: Jul. 12, 2011

(54) GROWTH METHOD OF NITRIDE SEMICONDUCTOR LAYER AND LIGHT EMITTING DEVICE USING THE GROWTH METHOD

(75) Inventors: Euijoon Yoon, Seoul (KR); Soon-Yong Kwon, New Haven, CT (US); Pilkyung Moon, Seoul (KR)

(73) Assignee: Seoul National University Industry Foundation, Seoul (KR)

( * ) Notice: Subject to any disclaimer, the term of this patent is extended or adjusted under 35 U.S.C. 154(b) by 0 days.

(21) Appl. No.: 10/596,126

(22) PCT Filed: Oct. 20, 2004

(86) PCT No.: PCT/KR2004/002688
§ 371 (c)(1),
(2), (4) Date: May 31, 2006

(87) PCT Pub. No.: WO2006/016731
PCT Pub. Date: Feb. 16, 2006

(65) Prior Publication Data
US 2007/0075307 A1    Apr. 5, 2007

(30) Foreign Application Priority Data
Aug. 13, 2004 (KR) .......................... 10-2004-0063722

(51) Int. Cl.
*H01L 29/06* (2006.01)

(52) U.S. Cl. .................................. 257/14; 257/E29.069

(58) Field of Classification Search ................ 257/94, 257/96, 97, 103, 21, 9–15, E29.069, E29.07, 257/E29.072, E29.033, E33.016, E33.023, 257/E33.025, E33.026, E33.031, E33.03, 257/E33.033, E33.008; 438/22; 117/90
See application file for complete search history.

(56) References Cited

U.S. PATENT DOCUMENTS

| | | | | |
|---|---|---|---|---|
| 5,670,798 A * | 9/1997 | Schetzina | ......................... | 257/96 |
| 5,810,925 A * | 9/1998 | Tadatomo et al. | ............... | 117/90 |
| 5,838,029 A * | 11/1998 | Shakuda | ......................... | 257/190 |
| 5,864,573 A | 1/1999 | Miura et al. | | |
| 6,133,589 A * | 10/2000 | Krames et al. | ................ | 257/103 |
| 6,303,404 B1 | 10/2001 | Moon et al. | | |
| 6,455,870 B1 * | 9/2002 | Wang et al. | ...................... | 257/12 |

(Continued)

FOREIGN PATENT DOCUMENTS
EP    0772249    5/1997

(Continued)

OTHER PUBLICATIONS

Kwon, Soon-Young, Effect of Growth Interruption on In-rich InGa/GaN single quantum well structure, Oct. 20, 2003, pp. 2831-2833, Wiley-VCH.*

(Continued)

*Primary Examiner* — Matthew C Landau
*Assistant Examiner* — Latanya Crawford
(74) *Attorney, Agent, or Firm* — Husch Blackwell LLP (57) ABSTRACT

Growing a first nitride semiconductor layer on an $Al_xGa_yIn_{1-x-y}N(0 \leq x \leq 1, 0 < y \leq 1, 0 < x+y \leq 1)$ layer, reducing the thickness of the first nitride semiconductor layer by growth interruption and, growing a second nitride semiconductor layer having a band gap energy higher than that of the first nitride semiconductor layer on the first nitride semiconductor layer with the reduced thickness and a light emitting device using the growth method.

10 Claims, 8 Drawing Sheets

U.S. PATENT DOCUMENTS

| | | | |
|---|---|---|---|
| 6,495,852 B1 * | 12/2002 | Mouri | 257/21 |
| 6,515,313 B1 * | 2/2003 | Ibbetson et al. | 257/103 |
| 6,781,147 B2 * | 8/2004 | Chen et al. | 257/11 |
| 6,906,352 B2 * | 6/2005 | Edmond et al. | 257/94 |
| 6,955,933 B2 * | 10/2005 | Bour et al. | 438/22 |
| 6,995,389 B2 * | 2/2006 | Kim et al. | 257/13 |
| 7,148,518 B2 * | 12/2006 | Sugawara et al. | 257/97 |
| 2001/0017874 A1 | 8/2001 | Ishida | |
| 2003/0015724 A1 * | 1/2003 | Nakamura et al. | 257/103 |
| 2003/0020085 A1 * | 1/2003 | Bour et al. | 257/101 |
| 2003/0151058 A1 * | 8/2003 | Uemura et al. | 257/98 |
| 2003/0209704 A1 * | 11/2003 | Yamada | 257/14 |
| 2003/0234404 A1 | 12/2003 | Matsuoka et al. | |
| 2004/0026699 A1 | 2/2004 | Baur et al. | |
| 2004/0195598 A1 * | 10/2004 | Tysoe et al. | 257/233 |
| 2005/0170537 A1 * | 8/2005 | Hooper et al. | 438/22 |
| 2005/0224781 A1 * | 10/2005 | Kneissl et al. | 257/14 |
| 2006/0243960 A1 * | 11/2006 | Shimizu et al. | 257/14 |

FOREIGN PATENT DOCUMENTS

| | | |
|---|---|---|
| EP | 1 403 910 | 3/2004 |
| JP | 07-189337 A | 7/1995 |
| JP | 09-036429 | 2/1997 |
| JP | 2000-225975 A | 8/2000 |
| JP | 2001-121824 A | 5/2001 |
| JP | 2004-095724 | 3/2004 |

OTHER PUBLICATIONS

M.G. Cheong et al., "Effects of growth interruption on the optical and the structural properties on InGaN/GaN quantum wells grown by metalorganic chemical vapor deposition", Journal of Applied physics, Dec. 1, 2001, vol. 90, No. 11, pp. 5642-5646.

* cited by examiner

| | | | | |
|---|---|---|---|---|
| InN | Eg = 0.7 eV | m*e = 0.042 m₀ | m*hh = 1.6 m₀ | (Case I) |
| | Eg = 1.9 eV | m*e = 0.11 m₀ | m*hh = 1.6 m₀ | (Case II) |
| GaN | Eg= 3.4 eV | m*e = 0.20 m₀ | m*hh = 1.9 m₀ | |

| Energy level | $E_{c,0}$ | $E_{v,0}$ | Emission energy level |
|---|---|---|---|
| Case I | 3.0982 eV | 0.2907 eV | 2.8075 eV (442 nm) |
| Case II | 3.2826 eV | 0.1265 eV | 3.1561 eV (393 nm) |

GROWTH METHOD OF NITRIDE SEMICONDUCTOR LAYER AND LIGHT EMITTING DEVICE USING THE GROWTH METHOD

CROSS-REFERENCE TO PRIOR APPLICATION

This is a U.S. National Phase Application under 35 U.S.C. §371 of International Patent Application No. PCT/KR2004/002688 filed Oct. 20, 2004, and claims priority of Korean Patent Application No. 10-2004-0063722, filed Aug. 13, 2004, both of which are incorporated by reference herein. The International Application was published in English on Feb. 16, 2006 as WO 2006/016731 A1 under PCT Article 21(2).

TECHNICAL FIELD

The present invention relates to development of a UV light source using nitride semiconductors, and more particularly, it relates to development of a nitride semiconductor light emitting device having a high light emission efficiency and a single light emission peak by using an In-rich InGaN quantum well layer with a thin thickness, instead of the conventional Ga-rich InGaN quantum well layer, as an active layer.

BACKGROUND ART

A Ga-rich InGaN quantum well layer comprising 10% or less of InN is mainly used to form a UV light source using nitride semiconductors. It is known that as the light emission wavelength is reduced, the light emission efficiency is lowered.

Generally, in case of a green or blue light source in the visible light range using nitride semiconductors, it is possible to obtain a high light emission efficiency in spite of a high defect density in a thin layer due to the absence of a proper substrate. This is because of the formation of a local carrier energy level caused by phase separation and composition nonuniformity of InN in the InGaN quantum well layer. It is known that this effect can be increased as the compositional rate of InN is increased.

However, in case of a UV light source, the InN composition in the InGaN quantum well layer is smaller than that in the visible light source, the local carrier energy level is rarely formed and thereby, the light emission efficiency is lowered. Also, as compared to the green or blue light source, the difference of energy level between an InGaN quantum well layer and a capping layer (or barrier layer) is small and thereby, the carrier confinement effect is reduced, causing a decrease in the light emission efficiency.

For these reasons, it is impossible to have a high light emission efficiency in the conventional UV light source using a Ga-rich InGaN quantum well layer with an InN composition of 10% or less.

DISCLOSURE

Technical Field

Accordingly, the present invention has been made to solve the above-mentioned problems occurring in the prior art, and it is an object of the present invention to provide a method for producing a high efficiency light emitting device having a emission wavelength in the UV range using an In-rich InGaN quantum well layer with a thin thickness as an active layer.

Also, it is another object of the present invention to provide a method for growing a quantum well layer comprising an In-rich region and a region with an In compositional grading (or In composition gradient) and a nitride semiconductor light emitting device using the same. In order to provide a light emitting device comprising an active layer having a desired wavelength, the wavelength of the active layer should be controllable or expectable. Through experiment and theoretical calculation, the present inventors have found that the PL (Photoluminescence) peak of an In-rich InGaN layer which has undergone sufficient growth interruption can be moved to the UV region. Based on the findings, the present invention is to provide a nitride semiconductor light emitting device comprising an In-rich InGaN quantum well layer with a controllable emission wavelength.

Technical Solution

To accomplish the above objects, according to the present invention, there is provided a growth method of nitride semiconductor layer comprising a first step for growing a first nitride semiconductor layer on an $Al_xGa_yIn_{1-x-y}N$ ($0 \leq x \leq 1$, $0 < y \leq 1$, $0 < x+y \leq 1$) layer, a second step for reducing the thickness of the first nitride semiconductor layer by growth interruption and a third step for growing a second nitride semiconductor layer having a band gap energy higher than that of the first nitride semiconductor layer on the first nitride semiconductor layer with the reduced thickness.

Here, the $Al_xGa_yIn_{1-x-y}N$ ($0 \leq x \leq 1$, $0 < y \leq 1$, $0 < x+y \leq 1$) layer, the first nitride semiconductor layer, and the second nitride semiconductor layer may be doped with p-type or n-type impurities and the $Al_xGa_yIn_{1-x-y}N$ ($0 \leq x \leq 1$, $0 < y \leq 1$, $0 < x+y \leq 1$) layer and the second nitride semiconductor layer are formed of preferably GaN.

Also, according to the present invention, there is provided a nitride semiconductor light emitting device comprising a substrate, at least one nitride semiconductor layer grown on the substrate and including an top layer of $Al_xGa_yIn_{1-x-y}N$ ($0 \leq x \leq 1$, $0 < y \leq 1$, $0 < x+y \leq 1$), a quantum well layer grown on the top layer of $Al_xGa_yIn_{1-x-y}N$ ($0 \leq x \leq 1$, $0 < y \leq 1$, $0 < x+y \leq 1$), and an additional nitride semiconductor layer grown on the quantum well layer and having a band gap energy higher than that of the quantum well layer, in which the quantum well layer comprises an In-rich region, a first compositional grading region with In content increasing between the top layer of $Al_xGa_yIn_{1-x-y}N$ ($0 \leq x \leq 1$, $0 < y \leq 1$, $0 < x+y \leq 1$) and the In-rich region, and a second compositional grading region with In content decreasing between the In-rich region and the additional nitride semiconductor layer.

Here, the top layer of $Al_xGa_yIn_{1-x-y}N$ ($0 \leq x \leq 1$, $0 < y \leq 1$, $0 < x+y \leq 1$), the quantum well layer and the additional nitride semiconductor layer may be doped with p-type or n-type impurities.

Also, according to the present invention, there is provided a nitride semiconductor light emitting device having a quantum well layer with a thickness of 2 nm or less, in which the two-dimensional quantum well layer is formed of $In_xGa_{1-x}N$, in which x is preferably 0.2 or more in the In-rich region of the two-dimensional quantum well layer. When the two-dimensional quantum well layer has a thickness of 2 nm or more, it is not easy to adjust the emission wavelength into the UV region by the carrier confinement effect. Therefore, the two-dimensional quantum well layer has preferably a thickness of 2 nm or less.

Also, according to the present invention, there is provided a nitride semiconductor light emitting device wherein the additional nitride semiconductor is made of $Al_yGa_{1-y}N$ ($0 \leq y \leq 1$). Of course, the additional nitride semiconductor layer may include In.

Also, according to the present invention, there is provided a nitride semiconductor light emitting device further comprising at least one barrier layer of $Al_yGa_{1-y}N$ ($0 \leqq y \leqq 1$) adjacent to the quantum well layer and having a band gap energy higher than that of the additional nitride semiconductor layer.

Also, according to the present invention, there is provided a nitride semiconductor light emitting device wherein the quantum well layer and the barrier layer of $Al_yGa_{1-y}N$ ($0 \leqq y \leqq 1$) are alternately laminated to form a multi-quantum well structure. Preferably the pairs of the quantum well and the barrier layer of $Al_yGa_{1-y}N$ ($0 \leqq y \leqq 1$) is 100 pairs or less.

Advantageous Effects

According to the present invention, using the growth interruption method, a thin and high quality In-rich InGaN quantum well layer is grown. Unlike the conventional UV optical device, in which a Ga-rich InGaN quantum well layer is used as an active layer, a thin In-rich InGaN quantum well layer with compositional grading is used, whereby it is possible to develop a high efficiency UV light source with a short wavelength, through the formation of local carrier energy level, carrier confinement effect and the formation of a single energy level in the energy band structure.

DESCRIPTION OF DRAWINGS

Further objects and advantages of the invention can be more fully understood from the following detailed description taken in conjunction with the accompanying drawings in which.

MODE FOR INVENTION

Now, the present invention is explained in further detail with reference to the attached drawings. The following examples may be changed into different forms and the present invention is not limited thereto. The examples are given to help those having ordinary knowledge to completely understand the present invention. In the drawings illustrating the embodiments of the present invention, the thicknesses of some layers or regions are magnified for precision of the specification and the same reference numerals indicate the same elements.

Figure 1:
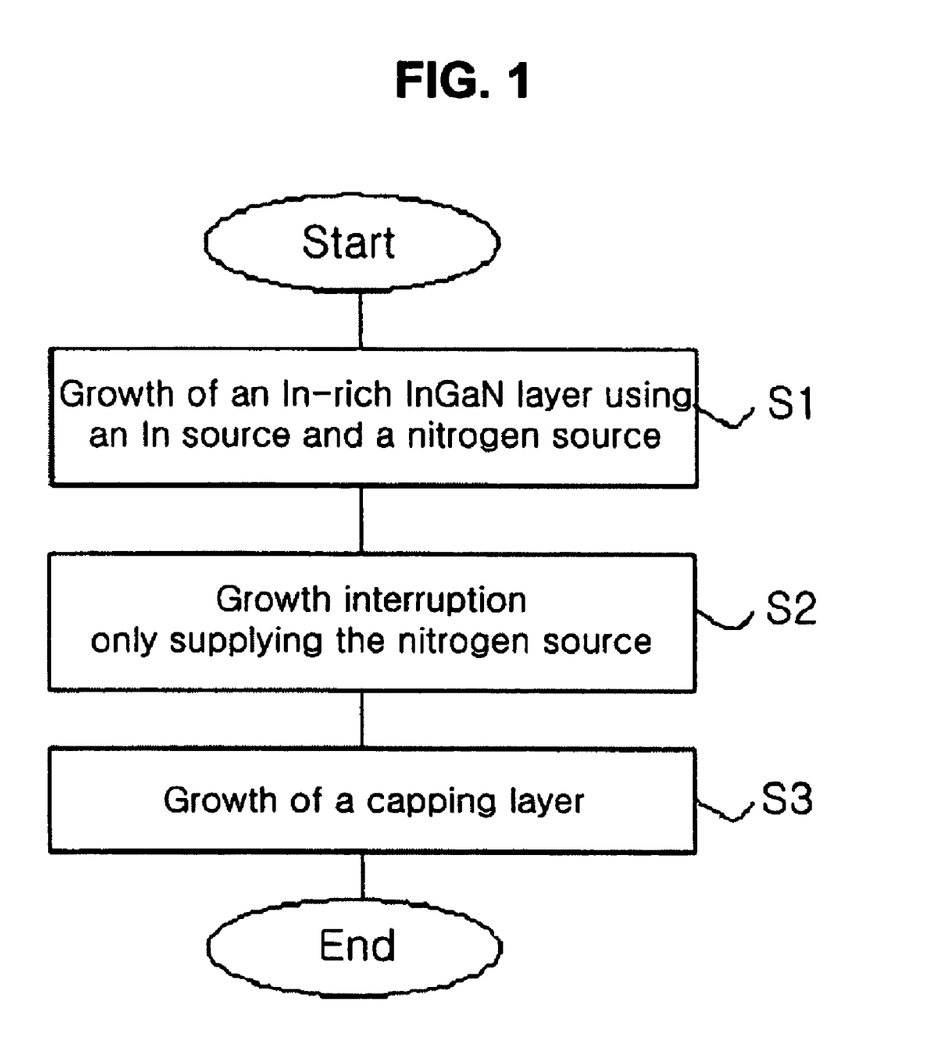
FIG. 1 is a flow chart for explanation of the method for growing an In-rich InGaN quantum well layer according to an embodiment of the present invention.
Figure 2:
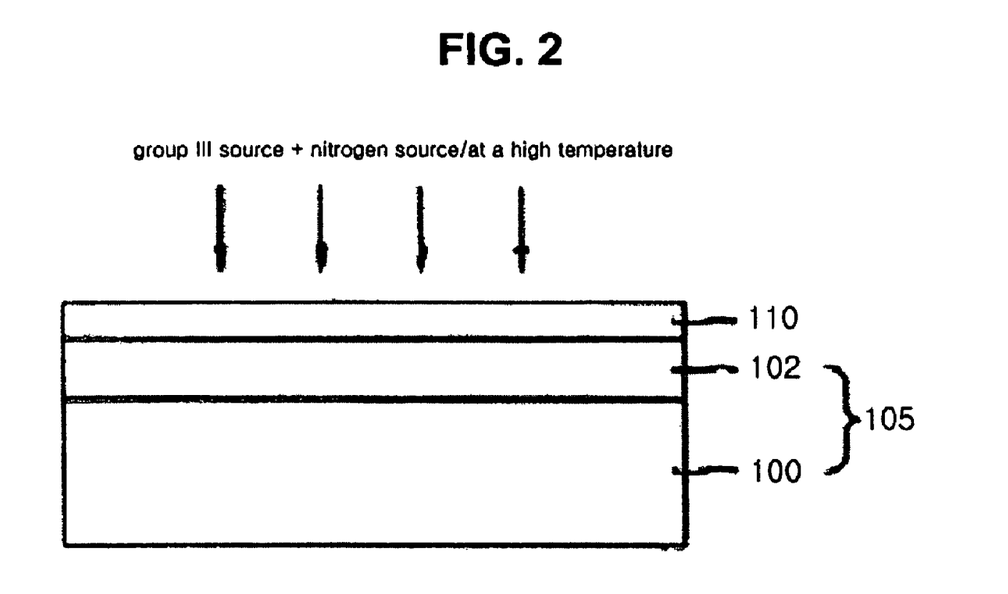
FIG. 2 to FIG. 4 are cross-sectional views to show each step of the method for growing an In-rich InGaN quantum well layer according to an embodiment of the present invention.
Figure 3:
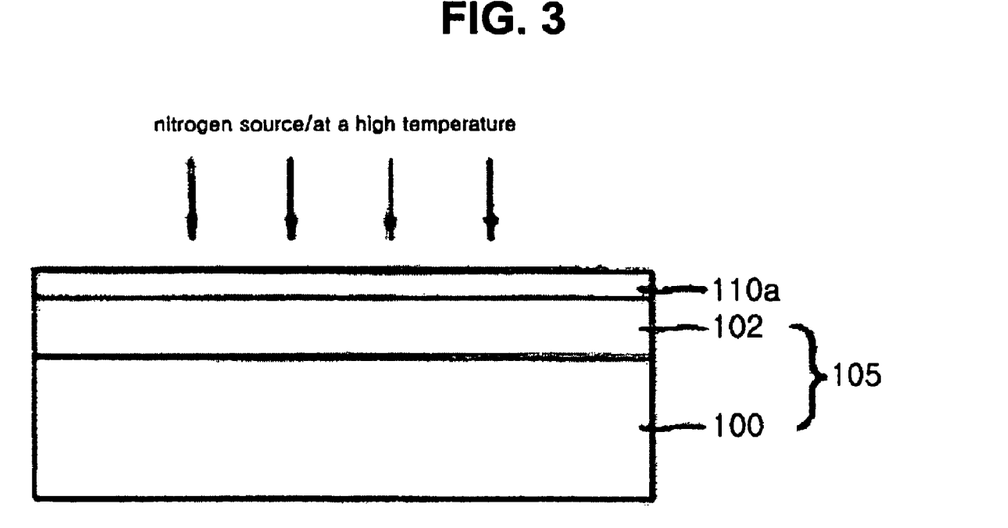
Figure 4:
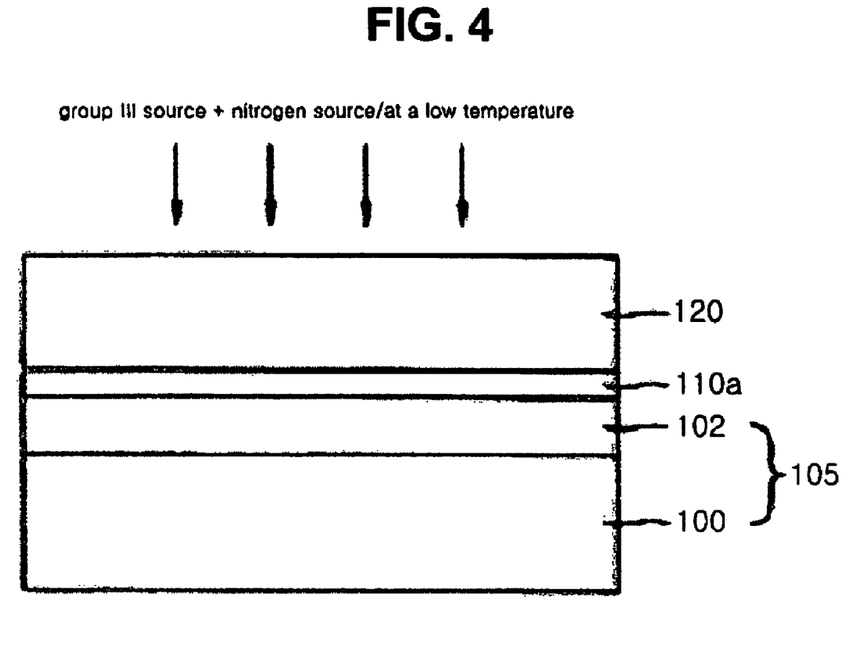

FIG. 1 is a flow chart for explanation of the method for growing an In-rich InGaN quantum well layer according to an embodiment of the present invention and FIG. 2 to FIG. 4 are cross-sectional views to show the respective steps of the method for growing an In-rich InGaN quantum well layer according to an embodiment of the present invention.

Referring to the step s1 of FIG. 1 and FIG. 2, an In-rich InGaN layer 110 is grown on a substrate 105 mounted in a chamber (not shown) at a temperature higher than the growth temperature of a general Ga-rich InGaN epitaxial layer by supplying a Group III source for In and a nitrogen source.

Since only the Group III source for In and the nitrogen source are supplied on the GaN substrate 105, it is expected that an InN layer is formed. However, in practice, intermixing of atoms and defect generation occur in an InN layer having a thickness of 1~2 ML(monolayer) or more due to lattice mismatch of 10% or more between GaN an InN. As a result, the In-rich InGaN layer 110 with compositional grading and a high defect density is formed.

In this embodiment, the substrate 105 is a GaN substrate comprising a GaN epitaxial layer 102 grown to a thickness of 1 μm or more on a hetero-substrate 100, which is made of a different material from GaN, at a high temperature of 1000° C. or more by a conventional 2-step method. Here, the hetero-substrate 100 is for example, a Si, SiC, GaAs or sapphire ($Al_2O_3$) substrate. However, the In-rich InGaN layer 110 may be grown on a single crystal GaN substrate 102 which is grown by HVPE without using the hetero-substrate 100.

In a preferred embodiment, when the In-rich InGaN layer 110 is grown using a MOCVD (metalorganic chemical vapor deposition) apparatus, the substrate 105 is kept at a high temperature of 700° C. to 800° C. Here, since the decomposition of the thin layer may take place due to a high equilibrium vapor pressure of the In-rich InGaN layer 110, a sufficient amount of the Group III source and the nitrogen source are supplied so that the deposited layer can cover the entire substrate 105. For example, the amount of the Group III source and the nitrogen source flowing into the chamber is about 10 times of the amount used conventionally. If TMIn (Trimethylindium) has been conventionally supplied to the chamber at 30 sccm to grow a bulk InN layer, 300 sccm of TMIn is supplied according to the present invention. The In-rich InGaN layer 110 grown using a sufficient amount of the Group III source and the nitrogen source at a high temperature has a relatively uneven surface and a lot of defects due to the increase of deformation energy caused by the lattice mismatch with the substrate 105. The In-rich InGaN layer 110 may be grown at 700° C. or less, for example, 650° C. In this case, it should be considered that the defect density may be increased due to the reduction of atom mobility in the In-rich InGaN layer 110 because of the relatively low growth temperature.

Next, referring to the step s2 of FIG. 1 and FIG. 3, growth interruption to intercept the supply of the Group III source is performed to convert the In-rich InGaN layer 110 into a two-dimensional nitride semiconductor buffered layer 110a with a uniform thickness.

Since the equilibrium vapor pressure of the nitride semiconductor is very high, during the growth interruption, much decomposition occurs in the In-rich InGaN layer 110. Particularly, this decomposition phenomenon takes place more vigorously at the protruded region (convex surface) in the In-rich InGaN layer 110. Through the decomposition, the movement from the surface of molecules, and the diffusion in the thin layer, the nitride semiconductor buffered layer 110a has a reduced thickness and the surface becomes flat after the growth interruption. Therefore, by properly controlling the growth interruption time, it is possible to obtain a flat and thin In-rich InGaN layer 110a having a thickness of about 1 nm. The growth interruption time is set in the range of 60 seconds or less, depending on the desired thickness. The growth interruption time may vary according to the growth temperature of the In-rich InGaN layer 110, and thus, it should not be construed that the present invention is limited to the growth interruption time of 60 seconds or less. Yet, it should be considered that the defect density in the thin layer may be increased when the growth interruption time is increased.

After the growth interruption step, the In-rich InGaN layer 110a has the defects considerably reduced. During the growth interruption, the growth interruption temperature is kept at a high temperature equal to the growth temperature of the In-rich InGaN layer 110. Right after the deposition, the In-rich InGaN layer 110 having a high defect density and a nonuniform thickness turns to the In-rich InGaN buffered layer 110a having a low defect density and a thickness of about 1 nm by the selective decompositon, the movement from the surface of molecules in protruded region, and the diffusion in the thin layer during the growth interruption.

Next, according to the step s3 of FIG. 1, a nitride semiconductor capping layer 120 is grown on the In-rich InGaN layer 110a having a reduced defect density by the growth interruption at the same or higher temperature for application as an optical device as shown in FIG. 4. The nitride semiconductor capping layer 120 is grown using a material having a energy band gap greater than that of the In-rich InGaN layer 110a. In a preferred embodiment, GaN, AlN or AlGaN based material is appropriate for the nitride semiconductor capping layer 120. Here, the nitride semiconductor capping layer 120 is grown at a temperature equal to the growth temperature of the In-rich InGaN layer 110 or at a temperature higher than the growth temperature of the In-rich InGaN layer 110 for the improvement of properties. The thickness may vary from several nm to several tens nm, as needed. In order to shift the emission wavelength to the short wavelength region, a thin barrier layer having a band gap energy higher than that of the capping layer may be applied on one side or both sides of the In-rich InGaN layer.

Thus, according to the present invention, by using an In-rich InGaN epitaxial layer having a thickness of about 1 nm as an active layer on the substrate instead of the conventional Ga-rich InGaN epitaxial layer, it is possible to considerably improve the formation of local carrier energy level and the carrier confinement effect in the quantum well structure. As a result, it is possible to produce an optical device with an improved light emission efficiency.

The present invention is explained in further detail by the following experimental examples and the contents which are not described herein are omitted since those skilled in the art may technically infer them. Also, the following examples do not intend to limit the present invention.

The crystal growing method used for forming each thin layer in this example was a low-pressure MOCVD with a chamber pressure of 300 Torr and a GaN substrate comprising a GaN epitaxial layer grown to a thickness of 2 μm on a sapphire substrate was used as a substrate.

As the Group III source and the nitrogen source, TMIn (Trimethylindium), TMGa (Trimethylgallium), ammonia and the like were used and as the carrier gas, $H_2$ or $N_2$ gas was used.

First of all, the GaN substrate was heated to 1100° C. and kept at that temperature for 5 minutes to remove surface impurities. Here, ammonia as a nitrogen source was flown, using $H_2$ gas as a carrier gas, to prevent the decomposition of the GaN epitaxial layer at the high temperature.

Then, the temperature of the substrate was lowered to 730° C. to grow an In-rich InGaN quantum well layer. After the temperature was lowered to 730° C., the carrier gas was changed to $N_2$ gas and TMIn and ammonia were supplied to grow an InN layer for 90 seconds. However, the produced InN layer had nonuniform thickness and defects. Also, due to the atoms-intermixing phenomenon between the InN layer and the GaN substrate disposed below, in practice, not the InN layer but an In-rich InGaN epitaxial layer with compositional grading was formed.

Figure 5:
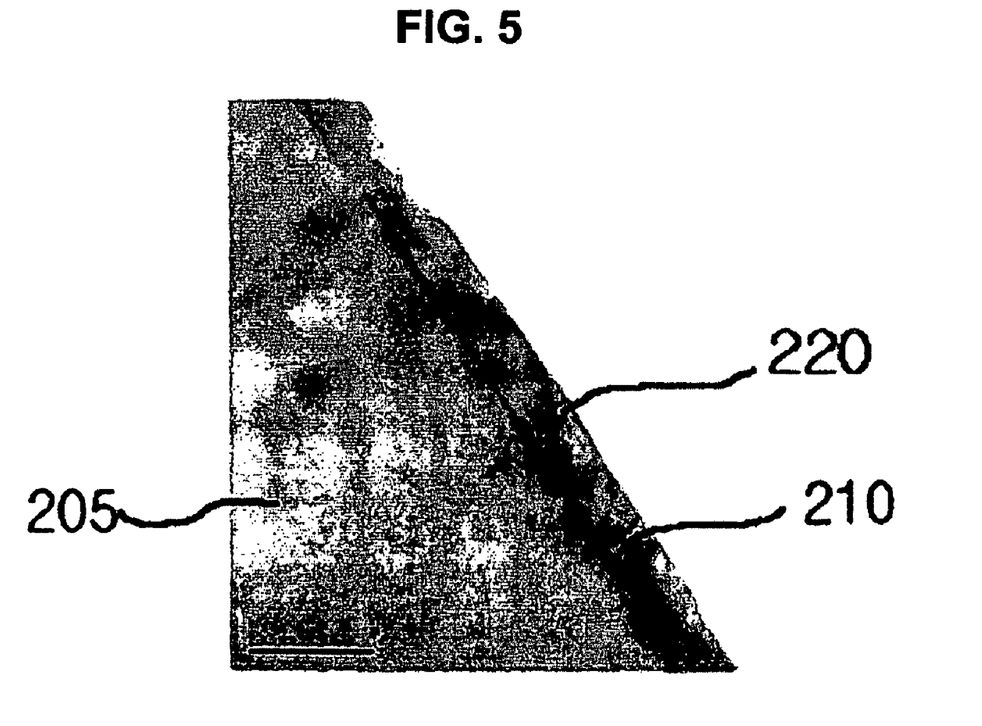
FIG. 5 to FIG. 7 are transmission electron microscope photographs showing the change in layers by growth interruption of In-rich InGaN/GaN quantum well structure according to an embodiment of the present invention.

FIG. 5 is a transmission electron microscope photograph taken after an In-rich InGaN layer with compositional grading was grown at 730° C. and a GaN capping layer having a thickness of 20 nm was formed at the same temperature. As shown in FIG. 5, when the GaN capping layer 220 was grown right after the high temperature In-rich InGaN layer 210 was formed on the GaN substrate 205 without growth interruption, the produced high temperature In-rich InGaN layer 210 having a thickness of about 2.5 nm showed nonuniformity in thickness and the GaN capping layer 220 grown thereon showed a high defect density.

Figure 6:
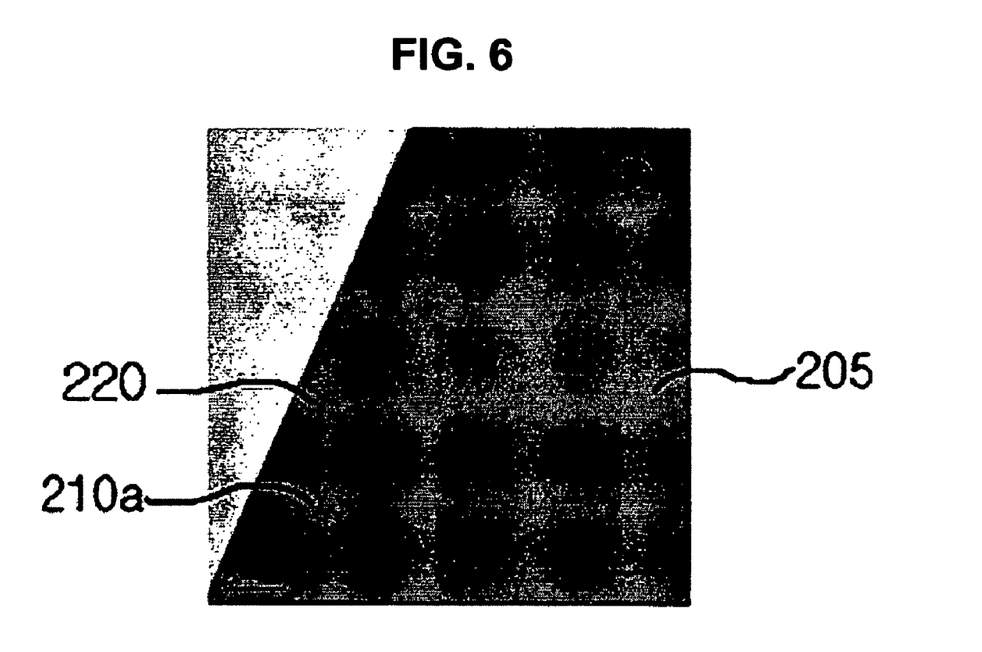

FIG. 6 is a transmission electron microscope photograph taken after the In-rich InGaN layer which has been grown at 730° C. is subjected to the growth interruption for 10 seconds by supplying only ammonia while intercepting the supply of TMIn and a GaN capping layer is covered thereon. As shown in FIG. 6, after the growth interruption, the thickness of the In-rich InGaN layer 210a become uniform to 1 nm and the GaN capping layer 220 grown thereon showed a remarkably reduced defect density as compared to the case shown in FIG. 5.

Figure 7:
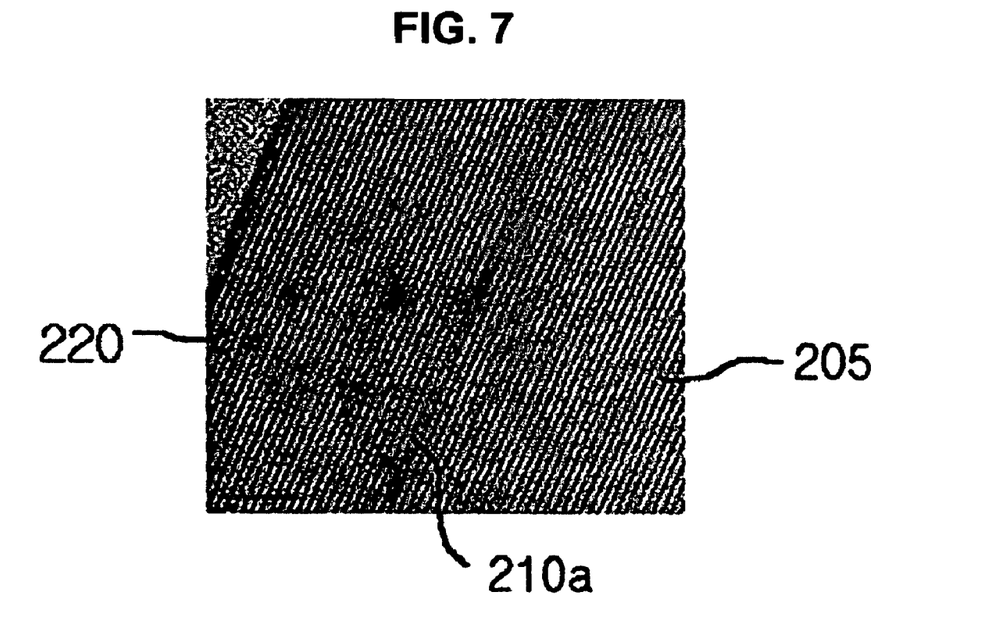

FIG. 7 is a high resolution transmission electron microscope photograph taken after the growth interruption for 10 seconds. As shown in FIG. 6 and FIG. 7, by the growth interruption for 10 seconds, the In-rich InGaN layer 210a was uniform in thickness and had a smooth interface with the GaN capping layer 220.

Like this, after the flat In-rich InGaN layer with a thickness of 1 nm was formed through growth and growth interruption at 730° C., the GaN capping layer was grown to 20 nm at the same temperature for the formation of a single quantum well structure. advantageous effectsMeanwhile, a specimen of a GaN capping layer with a thickness of 2 nm was also grown for MEIS (Medium Energy Ion Scattering) study of In composition distribution in the InGaN layer.

Figure 8:
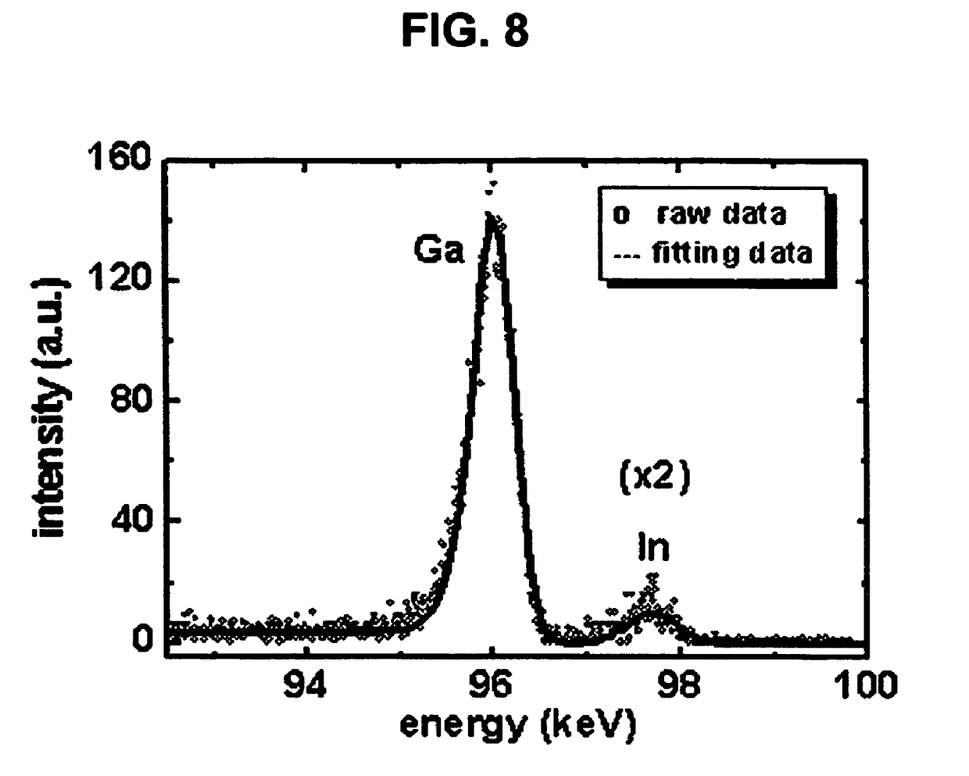
FIG. 8 is a view showing the results of MEIS (Medium Energy Ion Scattering) measurement and computational simulation to obtain the In composition distribution in the InGaN layer of the In-rich InGaN/GaN quantum well structure according to an embodiment of the present invention.

FIG. 8 is a view showing the "results of MEIS measurement and computational simulation of the In composition distribution in the In-rich InGaN/GaN quantum well structure having compositional grading, grown as described above. The MEIS method is a non-destructive method capable of precisely measuring the composition in a very thin layer at an atom level resolution. The computational simulation was performed using the 'SIMPLE' program which is made by slightly revising the conventional ISAP (Ion Scattering Analysis Program) to examine the composition change according to the thickness of the InGaN well layer.

On the MEIS measurement, the specimen of the GaN capping layer grown to a thickness of 2 nm was used to increase sensitivity on the surface. As a result, it was found that the In-rich InGaN layer having a thickness of 0.43 nm was present and the In content in this layer was about 60 to 70%, which was within the range of 50 to 80% resulted from the theoretical calculation. Also, it was found that In compositional grading was present in the InGaN/GaN interfaces. It was shown by the computational simulation, that 0.12 nm InGaN having an In content of 10% was present to the direction of the GaN capping layer, and 0.25 nm InGaN having an In content of 30% was present to the direction of the GaN substrate. The total thickness of the InGaN layer obtained by the MEIS measurement was o.δ nm which agreed with the result of the high resolution electron transmission image in FIG. 7.

Figure 9:
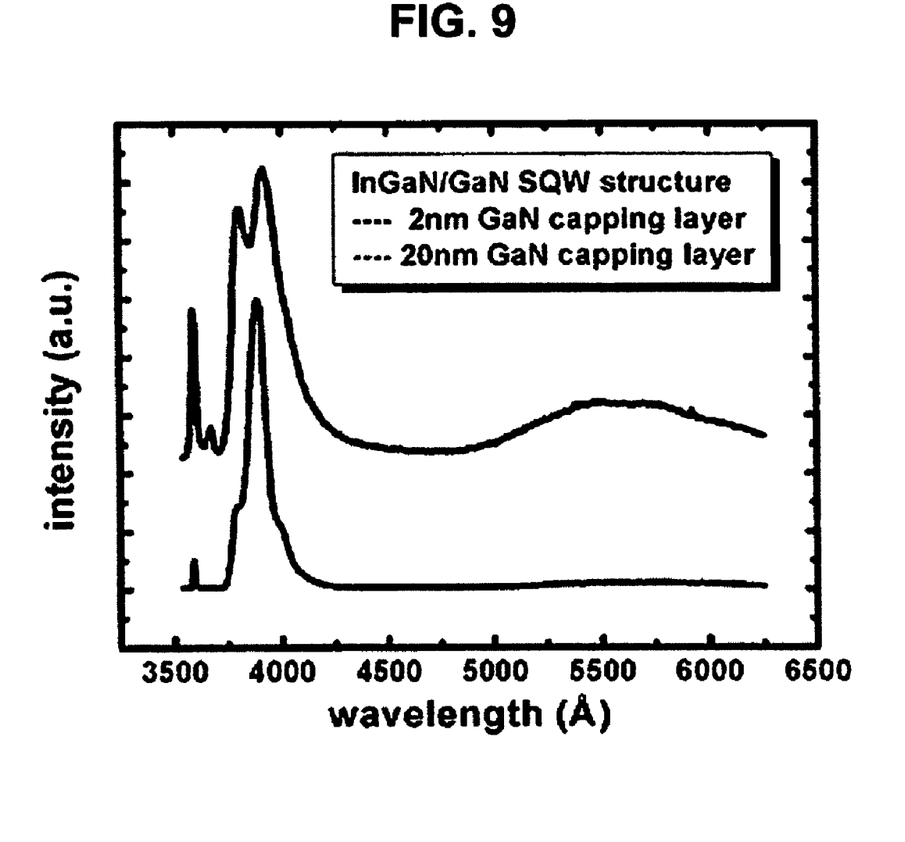
FIG. 9 is a view showing the result of PL (Photoluminescence) measurement showing the change of light emission peak at various thicknesses of the GaN capping layer upon the growth of the In-rich InGaN/GaN quantum well structure according to an embodiment of the present invention.

FIG. 9 shows photoluminescence (PL) peak spectra resulting from the In-rich InGaN/GaN quantum well structure having compositional grading made by the above-described method, in which PL peak in the near UV region of about 400 nm was present regardless of the thickness of the GaN capping layer.

This means that the energy level in InGaN/GaN quantum well structure was not affected by the change in the thickness of the capping layer. It is believed that this is because the high deformation energy caused by the high lattice mismatch of 10% or more was relieved by depositing InN on the GaN substrate.

Figure 10:
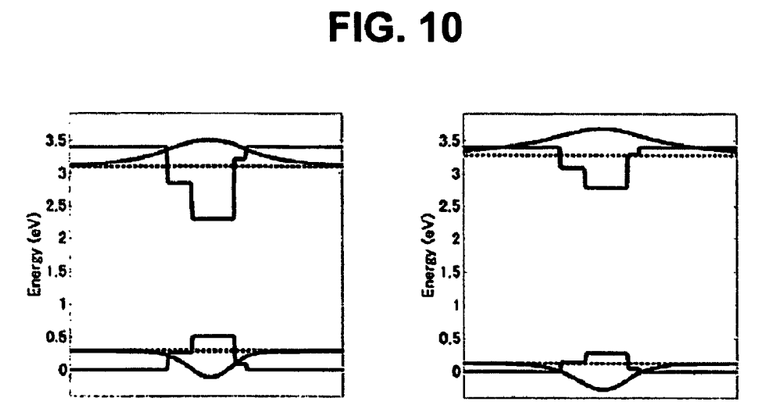
FIG. 10 is a view showing energy levels and wave functions in the energy band diagram of the In-rich InGaN/GaN quantum well structure having compositional grading to explain the PL result of FIG. 9 according to an embodiment of the present invention, based on the result of FIG. 8.

FIG. 10 shows the energy band diagram in $In_o.6Ga_o.4N$/GaN quantum well structure ($GaN/In_o.iGa_o.9N$ (0.12 nm)/$In_o.6Ga_o.4N$ (0.43 nm)/$In_o.3Ga_o.7N$ (0.25 nm)/GaN) with compositional grading, based on MEIS result.

Because of difficulty in growth due to, for example, high equilibrium vapor pressure, the properties of InN have not been precisely informed. Recently, some groups that succeeded in growing an InN thin layer by advancement of growth technology have reported that the band gap energy of InN is not 1.9 eV, as known to the art, but 0.7 eV. However, there is no report on the precise band gap energy of InN. Therefore, considering both cases, the light emission peaks in the $In_o.6Ga_o.4N$/GaN quantum well structure having compositional grading when the band gap energy of InN is 0.7 eV and 1.9 eV were calculated.

Figure 11:
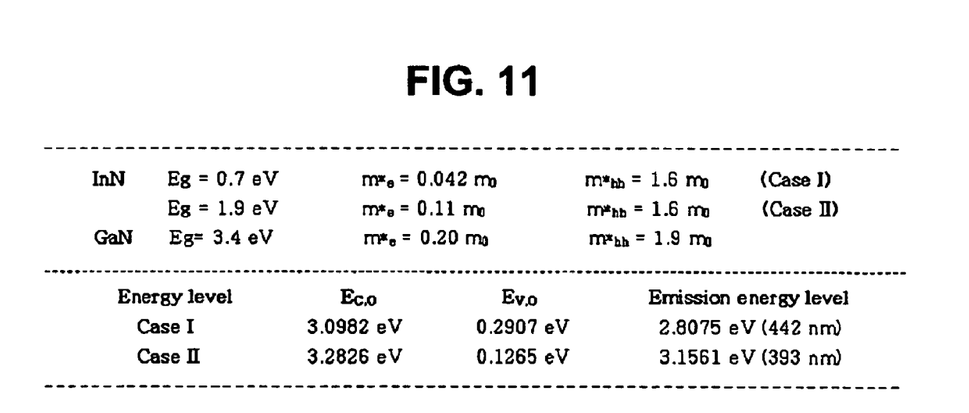
FIG. 11 is a view showing the calculation result of location of the light emission peak in the In-rich InGaN/GaN quantum well structure when the band gap energy of InN is 0.7 eV and 1.9 eV, based on the calculation result in the energy band diagram of FIG. 10.

FIG. 11 shows that the In-rich InGaN/GaN quantum well structure having compositional grading can have 400 nm light emission energy. For this calculation, the Schroedinger equation was solved using the Fourier series method calculating energy levels and wave functions in the frequency space. When the band gap energy of InN was 0.7 eV (1770 nm) and 1.9 eV (653 nm), it was found that by forming the In-rich InGaN/GaN quantum well structure, the emission peak was reduced to 442 nm and 393 nm, respectively.

Of course, considering the inaccuracy in values of InN related material constants, these data are not absolute but it was proved that the emission in the In-rich InGaN/GaN quantum well structure having compositional grading could be observed in the near UV region. Also, since this structure showed only one energy level, a near UV light source of a single wavelength could be obtained upon application to an optical device, regardless of the number of excited carriers.

Also, it was possible to shift the emission wavelength to the shorter wavelength region by forming a thin barrier layer having a band gap energy higher than that of the capping layer on one side or both sides of the In-rich InGaN layer. For example, it was found through calculation that in case of the $In_o.6Ga_o.4N$/GaN quantum well structure having compositional grading, the emission wavelength is shifted to 378 nm by forming an AlN barrier layer of 3 nm.

Up to now, the present invention is described by the example using the MOCVD method, however, MBE (molecular beam epitaxy) or CBE (chemical beam epitaxy) may be used.

Up to now, the preferred embodiment of the present invention has been described. However, it is clear that various modifications can be made without departing the scope of the present invention.

Figure 12:
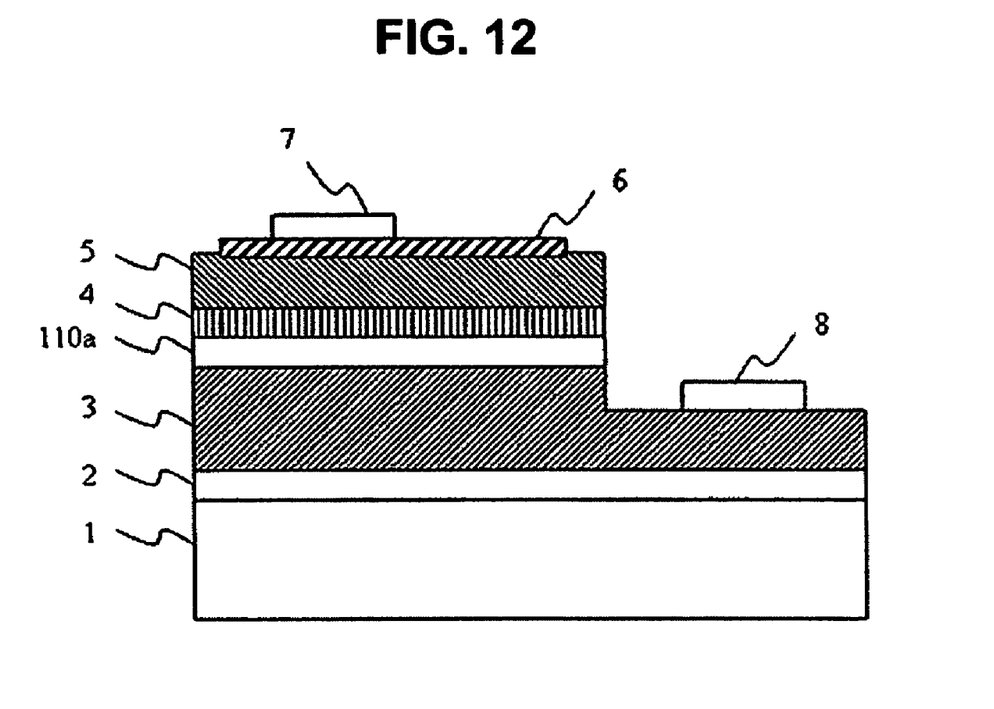
FIG. 12 is a view showing a light emitting device comprising a quantum well layer structure according to the present invention.

FIG. 12 is a view showing a light emitting device comprising a single quantum well structure according to the present invention. The light emitting device comprises a substrate 1, a buffer layer 2 grown on the substrate 1, an n-type contact layer 3 of $Al_xGa_yIn_{1-x-y}N$ ($0 \leq x \leq 1$, $0 < y \leq 1$, $0 < x+y \leq 1$) grown on the buffer layer 2, a quantum well layer 110a according to the present invention grown on the n-type contact layer 3, a capping layer 4 of p-type nitride semiconductor grown on the quantum well layer 110a, a p-type contact layer 5 of $Al_xGa_yIn_{1-x-y}N$ ($0 \leq x \leq 1$, $0 < y \leq 1$, $0 < x+y \leq 1$) grown on the capping layer 4, a light-transmittable electrode layer 6 and a p-type pad 7 formed on the p-type contact layer 5, and an n-type electrode 8 formed on the n-type contact layer 3. Here, the capping layer 4 and the p-type contact layer 5 may be formed of the same material.

Figure 13:
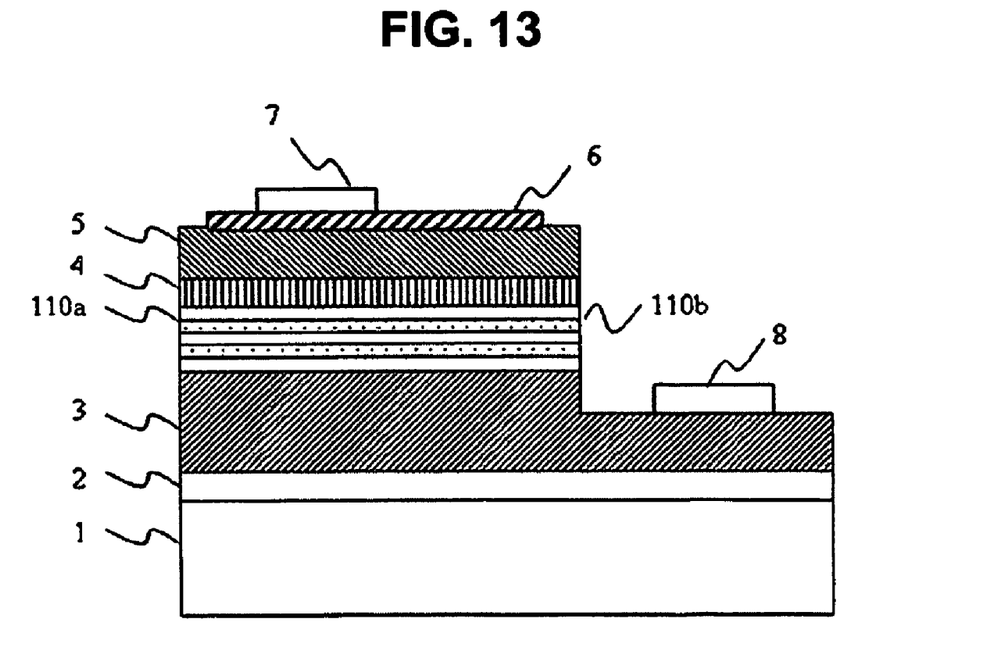
FIG. 13 is a view showing a light emitting device comprising a multi-quantum wells structure according to the present invention.

FIG. 13 is a view showing a light emitting device comprising a multi-quantum wells structure according to the present invention which has a structure comprising the quantum well layer 110a and the barrier layer 110b laminated alternately unlike FIG. 12.

The light emitting device according to the present invention is not limited to the structures shown in FIG. 12 and FIG. 13. On the basis of the quantum well layer 110a, an $Al_xGa_yIn_{1-x-y}N$ ($0 \leq x \leq 1$, $0 < y \leq 1$, $0 < x+y \leq 1$) layer disposed under the quantum well layer 110a and a capping layer disposed over the quantum well layer 110a, the light emitting device can be expanded to any light emitting device (such as light emitting diode and laser diode) with any structure that is clear to the person in the art.

The invention claimed is:

1. A nitride semiconductor light emitting device for emitting ultraviolet light comprising:
   a substrate;
   at least one nitride semiconductor layer grown on the substrate and including a top layer of $Al_xGa_yIn_{1-x-y}N$ ($0 \leq x \leq 1$, $0 < y \leq 1$, $0 < x+y \leq 1$);
   a single quantum well layer grown on the top layer of $Al_xGa_yIn_{1-x-y}N$ ($0 \leq x \leq 1$, $0 < y \leq 1$, $0 < x+y \leq 1$), the quantum well layer being made of In-rich InGaN resulting from the lattice mismatch with the top layer of $Al_xGa_yIn_{1-x-y}N$ ($0 \leq x \leq 1$, $0 < y \leq 1$, $0 < x+y \leq 1$) and Ga in the In-rich InGaN being mainly supplied from the top layer of $Al_xGa_yIn_{1-x-y}N$ ($0 \leq x \leq 1$, $0 < y \leq 1$, $0 < x+y \leq 1$); and,
   an additional nitride semiconductor layer grown on the In-rich InGaN quantum well layer and having a band gap energy higher than that of the In-rich InGaN quantum well layer;
   wherein the In-rich InGaN quantum well layer comprises an In-rich region formed of $In_xGa_{1-x}N$, where x in the In-rich region of the quantum well layer is greater than 0.5 and less than or equal to 0.8, a first compositional grading region with In content increasing between the top layer of $Al_xGa_yIn_{1-x-y}N$ ($0 \leq x \leq 1$, $0 < y \leq 1$, $0 < x+y \leq 1$) and the In-rich region, and a second compositional grading region with In content decreasing between the In-rich region and the additional nitride semiconductor layer wherein the second compositional grading region substantially overlies the first compositional grading region, wherein the light emitting device is configured to emit ultraviolet light using said In-rich InGaN quantum well layer, wherein the quantum well layer is grown using an In source and a nitrogen source, and the thickness of the quantum well is reduced by growth interruption which is performed by supplying the nitrogen source with the supply of the In source intercepted to flatten the surface of the quantum well layer.

2. The nitride semiconductor light emitting device in claim 1, wherein the quantum well layer is formed of $In_xGa_{1-x}N$ and x in the In-rich region of the quantum well layer is equal to or more than 0.6.

3. The nitride semiconductor light emitting device in claim 1, wherein the thickness of the quantum well is equal to or less than 2 nm.

4. The nitride semiconductor light emitting device in claim 1, wherein the additional nitride semiconductor is formed of $Al_yGa_{1-y}N$ ($0 \leq y \leq 1$).

5. The nitride semiconductor light emitting device in claim 1, further comprising at least one barrier layer of $Al_yGa_{1-y}N$ ($0 \leq y \leq 1$) adjacent to the quantum well layer and having a band gap energy higher than that of the additional nitride semiconductor layer.

6. The nitride semiconductor light emitting device in claim 1, wherein the top layer of $Al_xGa_yIn_{1-x-y}N$ ($0 \leq x \leq 1$, $0 < y \leq 1$, $0 < x+y \leq 1$) is GaN.

7. The nitride semiconductor light emitting device in claim 2, x in the In-rich region of the quantum well layer is equal to or less than 0.7.

8. The nitride semiconductor light emitting device in claim 5, wherein the at least one barrier layer of $Al_yGa_{1-y}N$ ($0 \leq y \leq 1$) has a thickness equal to or less than 5 nm.

9. The nitride semiconductor light emitting device in claim 5, wherein the quantum well layer and the at least barrier layer of $Al_yGa_{1-y}N$ ($0 \leq y \leq 1$) are alternately laminated to form a multi-quantum well structure.

10. The nitride semiconductor light emitting device in claim 9, wherein the pairs of the quantum well and the at least barrier layer of $Al_yGa_{1-y}N$ ($0 \leq y \leq 1$) are equal to or less than 100 pairs.

* * * * *